(12) United States Patent
Shinoda et al.

(10) Patent No.: US 8,705,841 B2
(45) Date of Patent: Apr. 22, 2014

(54) PATTERN INSPECTION METHOD, PATTERN INSPECTION APPARATUS AND PATTERN PROCESSING APPARATUS

(75) Inventors: Shinichi Shinoda, Hitachi (JP); Yasutaka Toyoda, Mito (JP); Ryoichi Matsuoka, Yotsukaido (JP)

(73) Assignee: Hitachi High-Technologies Corporation, Tokyo (JP)

( * ) Notice: Subject to any disclaimer, the term of this patent is extended or adjusted under 35 U.S.C. 154(b) by 416 days.

(21) Appl. No.: 12/997,176

(22) PCT Filed: Jun. 5, 2009

(86) PCT No.: PCT/JP2009/060717
§ 371 (c)(1),
(2), (4) Date: Mar. 4, 2011

(87) PCT Pub. No.: WO2009/151105
PCT Pub. Date: Dec. 17, 2009

(65) Prior Publication Data
US 2011/0142326 A1 Jun. 16, 2011

(30) Foreign Application Priority Data
Jun. 12, 2008 (JP) .................................. 2008-153657

(51) Int. Cl.
*G06K 9/00* (2006.01)
*G06T 7/00* (2006.01)
(52) U.S. Cl.
CPC ...................................... *G06T 7/001* (2013.01)
USPC ........................................................ 382/149
(58) Field of Classification Search
USPC ................. 382/144, 145, 147–149; 356/237.2–237.5
See application file for complete search history.

(56) References Cited

U.S. PATENT DOCUMENTS

| 6,539,106 | B1 * | 3/2003 | Gallarda et al. | 382/149 |
| 7,024,041 | B2 * | 4/2006 | Sasa | 382/221 |
| 7,135,123 | B1 * | 11/2006 | Thompson et al. | 216/59 |

(Continued)

FOREIGN PATENT DOCUMENTS

| JP | 2002-006479 | 1/2002 |
| JP | 2002-031525 | 1/2002 |

(Continued)

OTHER PUBLICATIONS

Japanese Office Action issued in Japanese Patent Application No. 2008-153657 dated Jun. 19, 2012.

*Primary Examiner* — Anand Bhatnagar
*Assistant Examiner* — Soo Park
(74) *Attorney, Agent, or Firm* — McDermott Will & Emery LLP

(57) ABSTRACT

A pattern inspection apparatus for detecting an abnormality includes a storage, a compensator and an abnormality judger. The storage stores data based on a reference pattern associated with an object pattern as an object to detect an abnormality and including a first pattern edge portion and a second pattern edge portion. The compensator partially compensates a location of the first pattern edge portion to be shrunk or expanded based on the reference pattern such that the first pattern edge portion is to be placed at a location of a third pattern edge portion while the second pattern edge portion maintains the same size. The abnormality judger sets a tolerance based on the location compensated based on the reference pattern, and judges the object pattern as abnormal when an outline of the object pattern is fallen outside of the tolerance.

18 Claims, 12 Drawing Sheets

(56) References Cited

U.S. PATENT DOCUMENTS

| | | |
|---|---|---|
| 7,412,671 B2 | 8/2008 | Ito et al. |
| 7,796,801 B2 * | 9/2010 | Kitamura et al. ............. 382/141 |
| 7,817,844 B2 | 10/2010 | Kitamura et al. |
| 7,884,322 B2 * | 2/2011 | Sasajima et al. ............. 250/306 |
| 8,005,292 B2 * | 8/2011 | Sakai et al. .................. 382/149 |
| 8,045,789 B2 * | 10/2011 | Nishiura et al. ............. 382/149 |
| 8,090,186 B2 * | 1/2012 | Nagano ........................ 382/141 |
| 8,094,926 B2 * | 1/2012 | Harabe ......................... 382/152 |
| 8,111,898 B2 * | 2/2012 | Pang ............................ 382/141 |
| 8,131,059 B2 * | 3/2012 | Taguchi et al. .............. 382/149 |
| 8,355,562 B2 * | 1/2013 | Toyoda et al. ............... 382/149 |
| 8,363,923 B2 * | 1/2013 | Toyoda et al. ............... 382/145 |
| 2002/0015518 A1 | 2/2002 | Matsuoka |
| 2002/0191833 A1 * | 12/2002 | Kim ............................. 382/149 |
| 2005/0226494 A1 * | 10/2005 | Yamamoto et al. .......... 382/149 |
| 2006/0245636 A1 | 11/2006 | Kitamura et al. |
| 2007/0098249 A1 * | 5/2007 | Miyano et al. ............... 382/145 |
| 2008/0058977 A1 * | 3/2008 | Honda ......................... 700/110 |
| 2008/0260234 A1 * | 10/2008 | Yamashita ................... 382/144 |

FOREIGN PATENT DOCUMENTS

| | | |
|---|---|---|
| JP | 2005-098885 | 4/2005 |
| JP | 2005-277395 A | 10/2005 |
| JP | 2007-149055 | 6/2007 |

* cited by examiner (a) (b) (c)

PATTERN INSPECTION METHOD, PATTERN INSPECTION APPARATUS AND PATTERN PROCESSING APPARATUS

RELATED APPLICATIONS

This application is the U.S. National Phase under 35 U.S.C. §371 of International Application No. PCT/JP2009/060717, filed on Jun. 5, 2009, which in turn claims the benefit of Japanese Application No. 2008-153657, filed on Jun. 12, 2008, the disclosures of which Applications are incorporated by reference herein.

TECHNICAL FIELD

The present invention relates to an imaging method and an imaging apparatus thereof in which an electronic device pattern is picked up to be inspected at an arbitrary position of a sample by using a Critical-Dimension Scanning Electronic Microscope (CD-SEM) or the like.

BACKGROUND ART

In the production of semiconductor devices, to inspect in each process whether or not a pattern formed on a substrate has been formed in conformity with a design thereof, there has been heretofore broadly employed a CD-SEM or the like.

As a method to inspect the finish of a wiring pattern, there has been proposed, for example, an evaluation method in which distance between output data from a Computer Aided Design (CAD) and pattern data of a pattern measured by an SEM is measured to evaluate a contour of the pattern based on the measured distance ([Patent Literature 1]).

In addition, as a method to remarkably shorten the inspection time, there has been proposed an inspection method in which by setting, in a design pattern, a beltlike inspection region sandwiched between an outer peripheral obtained by adding an allowable value and an inner peripheral obtained by subtracting an allowable value, if coordinates of a contour of a pattern image produced by imaging a pattern as an inspection object are outside the inspection region, a defect is determined ([Patent Literature 2]).

Moreover, there has been proposed an inspection method in which tolerance data indicating a tolerance based on a design pattern and contour data of a contour of a pattern image produced by imaging a pattern as an inspection object are converted into polar coordinates to judge a defect according to presence or absence of a crossing point in the polar coordinates ([Patent Literature 3]).

CITATION LIST

Patent Literature

Patent Literature 1: JP-A-2002-31525
Patent Literature 2: JP-A-2002-6479
Patent Literature 3: JP-A-2005-98885

SUMMARY OF INVENTION

Technical Problem

The inspection method of [Patent Literature 1] above is accompanied by a problem in which although the measuring precision is improved by increasing the number of measuring points, a long period of time is required for the measuring. In this regard, [Patent Literature 2] and [Patent Literature 3] are capable of remarkably shortening the inspection time. Incidentally, depending on patterns, there exists a pattern which may be judged as normal if a clear abnormality such as bridging with an adjacent pattern or a disconnection of the pattern is absent. For example, according to [Patent Literature 2], it is possible to detect a disconnection or a contact of a pattern by disposing a tolerance on an inner side and an outer side. However, to regard deformation due to expansion and shrinkage as normal, it is required to expand the beltlike inspection region and to expand the tolerance by an upper-limit value and a lower-limit value of the crossing data of [Patent Literature 3]. However, if the region and the tolerance are expanded, it is likely to overlook a clear abnormality of a disconnection (d) of a pattern. Therefore, to regard deformation due to expansion or shrinkage of a pattern as normal and to detect a disconnection of a pattern without overlooking the disconnection, the setting of the tolerance or the setting of the upper-limit and lower-limit values of the crossing data have been quite difficult.

Also, due to various causes such as a stage moving error and the charging, the produced image is inclined. In this situation, the tolerance is exceeded although the pattern is normal and the pattern is judged as abnormal depending on cases.

In addition, for a pattern with a few features, the reference pattern generated based on the design data is different in positions from the produced pattern image in some cases.

The present invention, which has been devised to solve the problems above, has an object to provide a pattern inspection method and a pattern inspection apparatus for detecting only a clear abnormality such as bridging with an adjacent pattern or a disconnection of the pattern in a short period of time.

Furthermore, the present invention provides a pattern processing apparatus which obtains pattern inspection data to detect only a clear abnormality such as bridging with an adjacent pattern or a disconnection of the pattern in a short period of time.

Solution to Problem

The pattern inspection apparatus to solve the problems according to the present invention described above is a pattern inspection apparatus for detecting, based on image data of an object pattern obtained by picking up an image of an electronic device pattern, an abnormality such as a defect by use of a tolerance for pattern deformation, characterized by comprising reference pattern storage means for storing therein data based on a reference pattern associated with the object pattern as an object to detect an abnormality; image data storage means for storing therein data based on the image data obtained by picking up an image of the object pattern; tolerance generation means for generating data based on a tolerance of the object pattern by use of the data based on the reference pattern in the reference pattern storage means and the data based on the image pickup image data in the image data storage means; and abnormality judge means for judging an abnormality of the object pattern by use of the data based on the tolerance generated by the tolerance generation means, and the data based on the image pickup image data in the image data storage means.

Additionally, the pattern inspection method to solve the problems according to the present invention described above is a pattern inspection method of detecting, based on image data of an object pattern obtained by picking up an image of an electronic device pattern, an abnormality such as a defect by use of a tolerance for pattern deformation, characterized by comprising the steps of storing reference pattern data associated with the object pattern as an object to detect an abnormality; storing image data obtained by picking up an image of the object pattern; generating tolerance data of the object pattern by use of the reference pattern data and the image pickup image data; and judging an abnormality of the object pattern by use of the tolerance data and the image pickup image data.

Also, the pattern processing apparatus to solve the problems according to the present invention described above is a pattern processing apparatus for obtaining, based on image data of an object pattern obtained by picking up an image of an electronic device pattern, a tolerance for pattern deformation, characterized by comprising reference pattern storage means for storing therein data based on a reference pattern associated with the object pattern as an object to detect an abnormality; image data storage means for storing therein data based on the image data obtained by picking up an image of the object pattern; and tolerance generation means for generating data based on a tolerance of the object pattern by use of the data based on the reference pattern in the reference pattern storage means and the data based on the image pickup image data in the image data storage means.

Advantageous Effects of Invention

According to the present invention, there are provided a pattern inspection method, a pattern inspection apparatus, and a pattern processing apparatus for detecting only a clear abnormality such as bridging with an adjacent pattern or a disconnection of the pattern in a short period of time.

DESCRIPTION OF EMBODIMENT

Next, description will be given of modes of embodying a pattern inspection method and a pattern inspection apparatus according to the present invention. To verify whether or not a pattern has been formed in conformity with a design, the pattern is verified by use of an image of a plan view according to, for example, a shape measuring technique.

Figure 1:
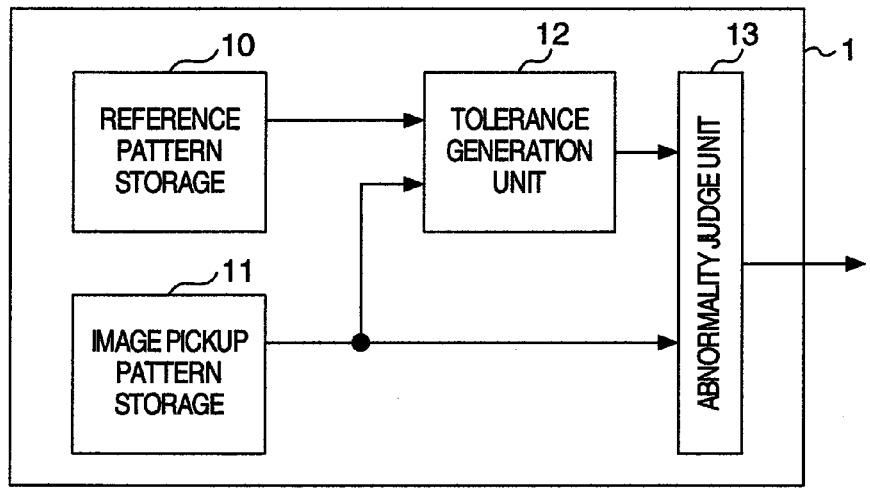
FIG. 1 is a block diagram showing a configuration of an apparatus of the present invention.

Next, description will be given of a configuration example of a pattern inspection apparatus of the present invention by use of FIG. 1.

In a reference pattern storage unit or storage 10, data of a reference pattern associated with a pattern as an inspection object has been stored. Specifically, a pattern image obtained through a conversion based on design data of an integrated circuit designed by CDA may be used as the reference pattern data. Further, a pattern image corrected through a proximity correction or the like may be used as the reference pattern data. Additionally, an image pickup image obtained by shooting or picking up a favorably finished pattern on a substrate based on the design data may be used as the reference pattern data. Since the reference pattern data is image data in general, the reference pattern data is assumed as a reference pattern image in the following description.

In an image pickup pattern storage 11, an image pickup pattern image obtained by shooting a pattern as an inspection object is stored. The image pickup pattern image may be a contour image of an image pickup pattern. In the following description, the image pickup pattern image is assumed as a contour image.

The reference pattern image in the reference pattern storage 10 and the image pickup pattern image in the image pickup pattern storage 11 are fed to a tolerance generation unit 12 to generate a tolerance to inspect the image pickup pattern image.

In a situation in which the image pickup pattern image is partially and considerably changed with respect to the reference pattern image or in which the image pickup pattern image slightly differs in the total inclination and an offset position from the reference pattern image, the image pickup pattern image is corrected based on the reference pattern image to generate the tolerance.

In an abnormality judge unit 13, an image pickup pattern image, actually shot or picked up, of an electronic device pattern is inspected based on the generated tolerance.

Figure 2:
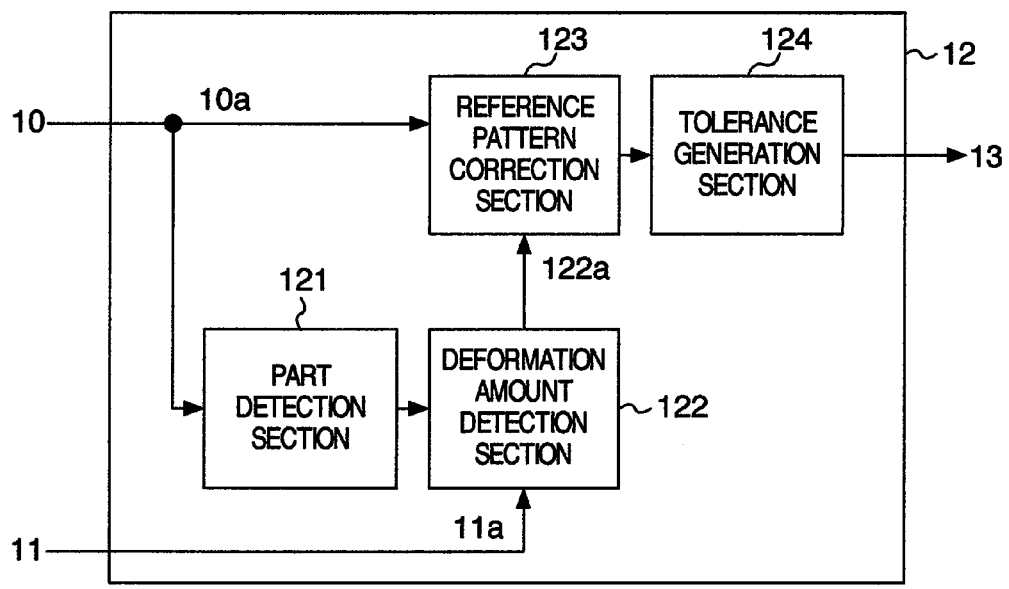
FIG. 2 is a diagram showing a configuration example of a tolerance generation unit of the present invention.

Referring to FIG. 2, description will be given of a configuration example of the tolerance generation unit according to the present invention.

In a part detection section 121, a part of a pattern is detected in the reference pattern image. For example, a corner section, a line end (projection) section, or a straight line section is detected to produce positional coordinates of the detected part. The positional coordinates may be values of coordinates in the x and y directions or distances and angles in polar coordinates. Moreover, although types of parts to be detected and the number of parts for each type are detected to be outputted in this situation, it is also considerable to detect only particular parts, for example, to detect only parts of the line end sections.

In a deformation amount detection section 122, based on the coordinates of parts detected by the part detection section 121, part positions of an associated image pickup pattern image are detected. By use of the coordinates of the parts of the image pickup pattern image and those of the parts of the reference pattern image obtained by the part detection section 121, difference values between part positions are obtained. Like the positional coordinates, the difference values may be difference between coordinates in the x and y directions or difference between distances and angles in polar coordinates. After this point, to simplify description, the positional coordinates and the difference values are assumed as values of x and y coordinates.

In a reference pattern correction section 123, the part of the reference pattern image detected by the part detection section 121 is corrected by using the difference values of the deformation amount detection section 122.

For example, based on the difference values obtained in the respective parts, a partial large change, a total inclination, an offset position, and the like of the image pickup pattern image are obtained to be reflected in the reference pattern image.

Figure 3:
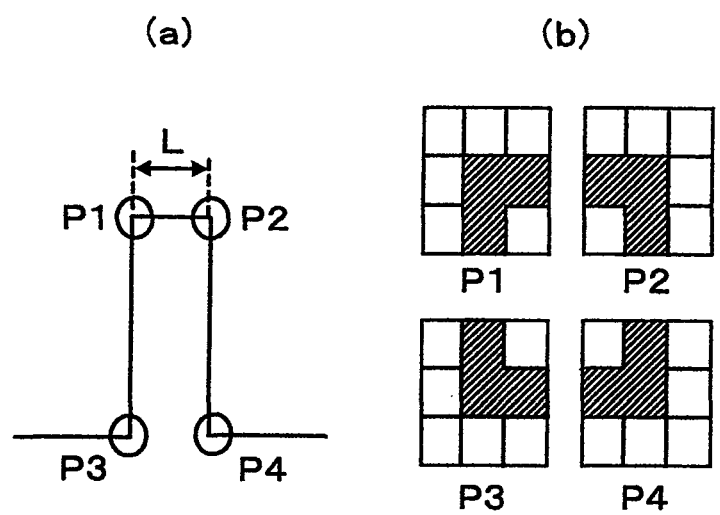
FIG. 3 is a diagram showing an embodiment of a partial region or part detection unit of the present invention.

In a tolerance generation unit 124, the tolerance is generated based on the corrected reference pattern image. FIG. 3 shows an embodiment of the part detection section. In this situation, the part detection is conducted by assuming, as the reference pattern image, an image generated based on the design data. For example, in a situation in which the image generated based on the design data is a convex image as shown in FIG. 3(*a*), corners of four patterns P1 to P4 are produced. In detection of corners, pattern matching is conducted by use of, for example, a corner detection filter of a 3×3 pixel matrix shown in FIG. 3(*b*) for P1 to P4, to thereby detect corner sections. When the corner sections P1 to P4 are detected, it is also possible to detect the convex section under the following conditions by assuming that the line has a width of L at the line end (edge point).

If P1 and P2 are in interval L: upward convex line end
If P3 and P4 are in interval L: downward convex line end
If P1 and P3 are in interval L: Leftward convex line end
If P2 and P4 are in interval L: Rightward convex line end Also, the section between the respective corners can be regarded as a straight line section. Additionally, the section between the corners may be regarded as a straight line section if the section has a length equal to or more than a particular length. Also, a straight line section may be detected by using a line detection filter. The user may also designate the line width L.

Furthermore, when the reference pattern image is a pattern deformed based on the design data or is an image pickup pattern image, it can be considered that a filter corresponding to the deformation is used as the corner section detection filter. For example, it is considerable to enlarge the filter size, and it is moreover considerable that the pattern is changed from a corner to a semicircle, the line width is changed, or the object image is processed, for example, by drawing a solid image for a closed figure. In this situation, the method is substantially equal to the matching employed to detect a part in an image pickup pattern image, which will be described later; hence, description thereof will be here avoided.

Figure 4:
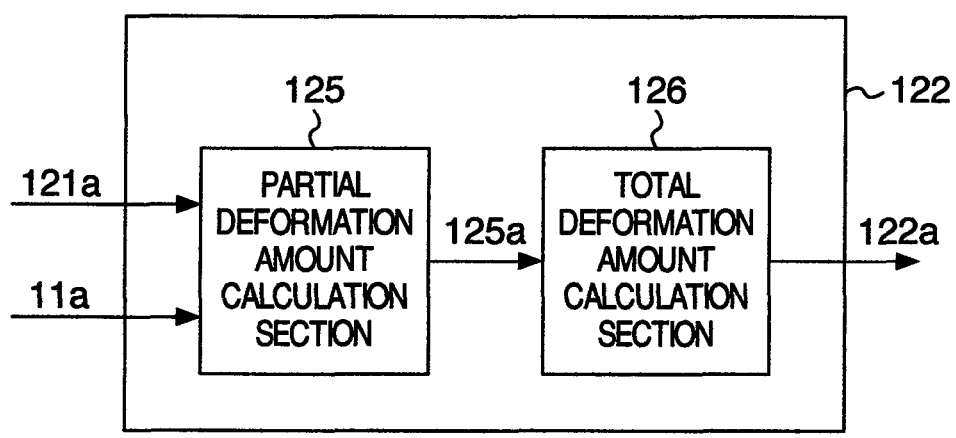
FIG. 4 is a diagram showing a block configuration example of a deformation amount detection unit of the present invention.

FIG. 4 shows a block configuration example of the deformation amount detection unit of the present invention.

The deformation amount detection section 122 includes a partial deformation amount calculation section 1221 and a total deformation amount calculation section 1222. The partial deformation amount calculation section 1221 receives, as inputs thereto, positional information of parts of the reference pattern image from the part detection section and image pickup image data stored in the image pickup pattern storage, and then calculates the amount of deformation of each part as a partial deformation amount. Based on each partial deformation amount, the total deformation amount calculation section 1222 calculates the amount of total deformation. The amount of total deformation described here includes a total offset value of the image pickup position and a change in the inclination (rotation) thereof. Based on the obtained total and partial deformation amounts, a partial deformation amount is again calculated. The obtained partial and total deformation amounts are inputted to the reference pattern correction section 123.

Figure 5:
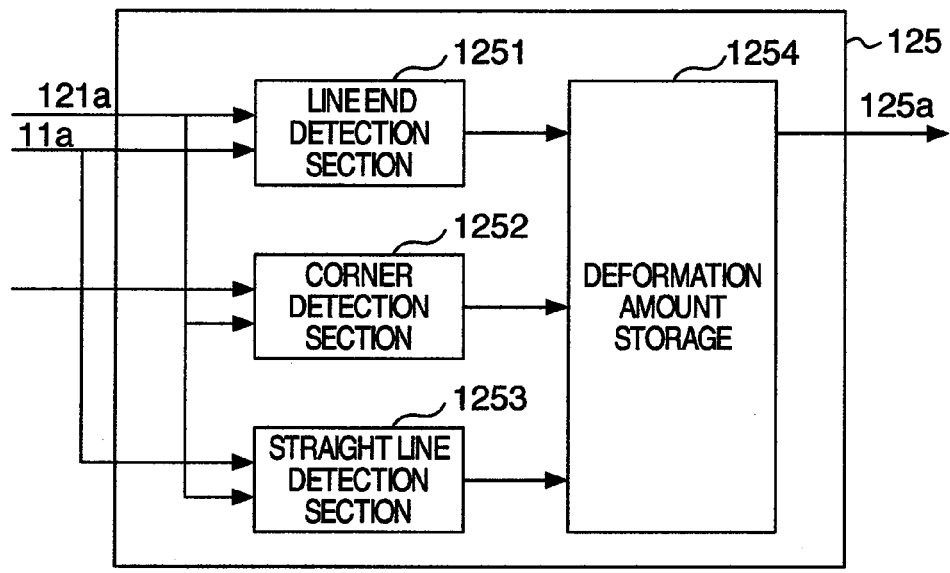
FIG. 5 is a diagram showing a block configuration example of a partial deformation amount recalculation unit of the present invention.

FIG. 5 shows a block configuration example of the partial deformation amount recalculation unit of the present invention. The partial deformation amount calculation section 1221 includes a line end detection section 1251, a corner detection section 1252, a straight line detection section 1253, and a deformation amount storage 1254 to store differential information of each detected position. The line end detection section 1251 receives as an input thereto the detected positional information of the line end from the part detection section 121. The line end detection section 1251 then detects a position of an associated line end in the image pickup pattern image based on the positional information of the line end obtained from the part detection section 121. The line end detection section 1251 obtains differential information between the positional information of the line end obtained from the part detection section 121 and the positional information of the associated line end in the image pickup pattern image, and then stores the differential information in the deformation amount storage 1254. The differential information may be difference in terms of coordinates in the x and y directions or difference in distances and angles in the polar coordinate system after conversion thereof. Also, in the deformation amount storage 1254, the positional information of a line end obtained from the part detection section 121 in association with the obtained differential information is also stored. If a plurality of line ends exist, the differential information is similarly obtained and is stored for each of the plural line ends. Both of the corner detection section 1252 and the straight line detection section 1253 also execute processing in a similar fashion as above.

Figure 6:
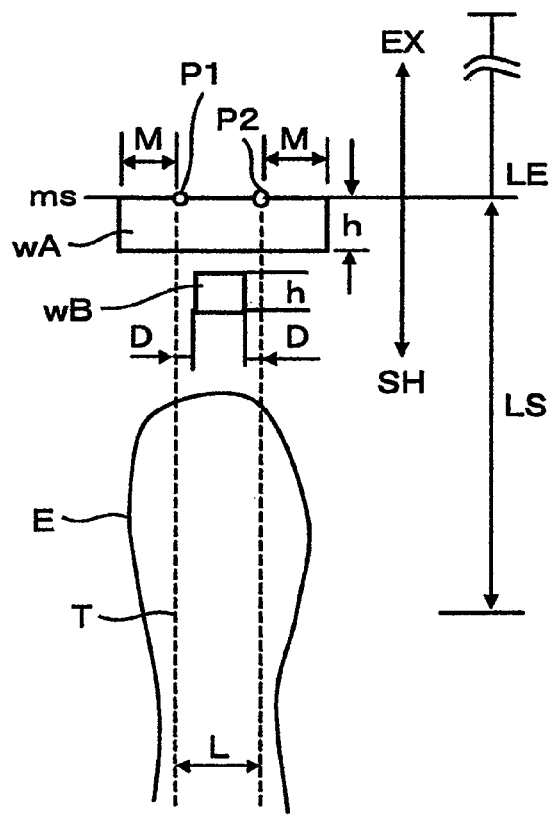
FIG. 6 is a diagram showing a concept of a line end detection unit of the present invention.

FIG. 6 shows an embodiment of the line end detection section of the present invention. This is an example to obtain the amount of deformation for a part of an upward convex line end, showing a state in which a reference pattern T, indicated by dotted lines, of design data of an integrated circuit designed by CAD is shot or picked up to resultantly obtain an image pickup pattern contour E.

Moreover, in the reference pattern storage 10, data of the reference pattern T corresponding to the pattern as an inspection object has been stored. As an image pickup result, data of the image pickup pattern contour E has been stored in the image pickup pattern storage 11. Description will now be given of operation and processing of the tolerance generation unit 12 to generate a tolerance by use of these data items.

An expanding direction or a shrinking direction is judged depending on whether or not the number of contour data items of a contour E of an image pickup pattern actually shot in a contour detection window wA as a range to detect a contour at a position of coordinates of a convex section (a pair of corners P1 and P2), detected by the part detection section 121, of a reference pattern T indicated by dotted lines is equal to or more than a particular number of pixels TH1 as a particular value. Ordinarily, the contour E of an image pickup pattern expands to be broader than the contour of the reference pattern T depending on cases; hence, the contour window wA is formed by expanding a range based on the coordinates of P1 and P2 by the particular number of pixels M toward both sides such that the detection window includes h pixels in the convex direction. If the number of contour data items is less than the particular number of pixels TH1, a shrinkage pattern is assumed to search the contour in a shrinking direction SH. Contrarily, if the number of contour data items is equal to or more than the particular number of pixels TH1, an expansion pattern is assumed to search the contour in an expanding direction. Description will now be given of a shrinkage pattern. In the search, although the contour detection window wA may be directly employed without modification thereof, the window may be reduced in its width. For example, based on the coordinates of P1 and P2, the width is reduced by a particular number of pixels D on both sides to search the contour by using a contour detection window wB including h pixels in the line direction. The search start point is ms in the line direction of P1 and P2. Since the pattern is a coordinate shrinkage pattern, a position where the number of pixels of the contour data of a contour E of the image pickup pattern is equal to or more than a particular number of pixels TH2 is detected by moving the contour detection window wB in a pixel-by-pixel fashion in the shrinking direction SH. The distance of movement up to the detection position is assumed as the deformation amount. By setting the deformation amount to the deformation amount storage 1254 of the partial deformation amount calculation section 125, it is possible to calculate the amount of deformation for each part.

As a result, by obtaining tolerance for each part of the reference pattern stored in the reference pattern storage 10 and by conducting comparison with an image pickup pattern image obtained by actually shooting a pattern as an inspection object, the abnormality judge unit 13 can judge the abnormality.

Figure 17:
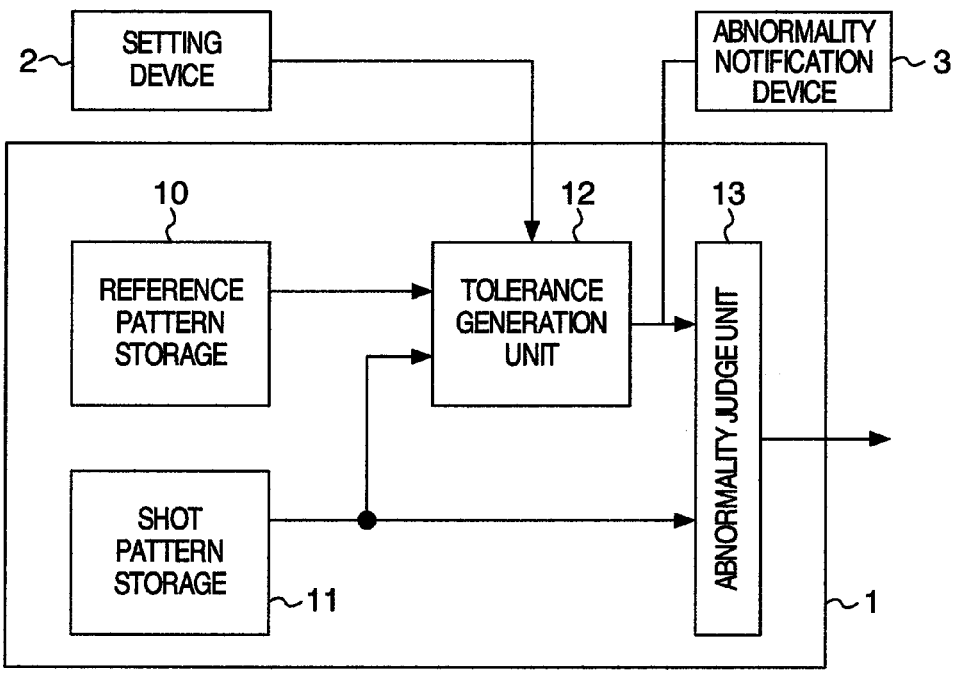
FIG. 17 is a block diagram showing a configuration of an apparatus of the present invention.

Furthermore, it is considerable to dispose a threshold for the length of the search. In this situation, there is arranged a mechanism in which a threshold is disposed as an allowance for the deformation amount such that any deformation exceeding the value of the allowance is not coped with. For example, it is possible that the threshold value is set as a search end position LS such that if the no contour is detected even if the search is conducted for the length, the search is terminated to determine an abnormality at this point of time. Also, the deformation amount when no contour is detected before the search end position LS may be indicated as the search end position LS or it is also possible to return to the search start position. In this situation, the operation can be realized by disposing a setting device for the user to set the allowance threshold value for the amount of deformation as shown in FIG. 17. The operation can be realized by inputting a signal from the setting device 2 to the deformation amount detection section 122.

Figure 18:
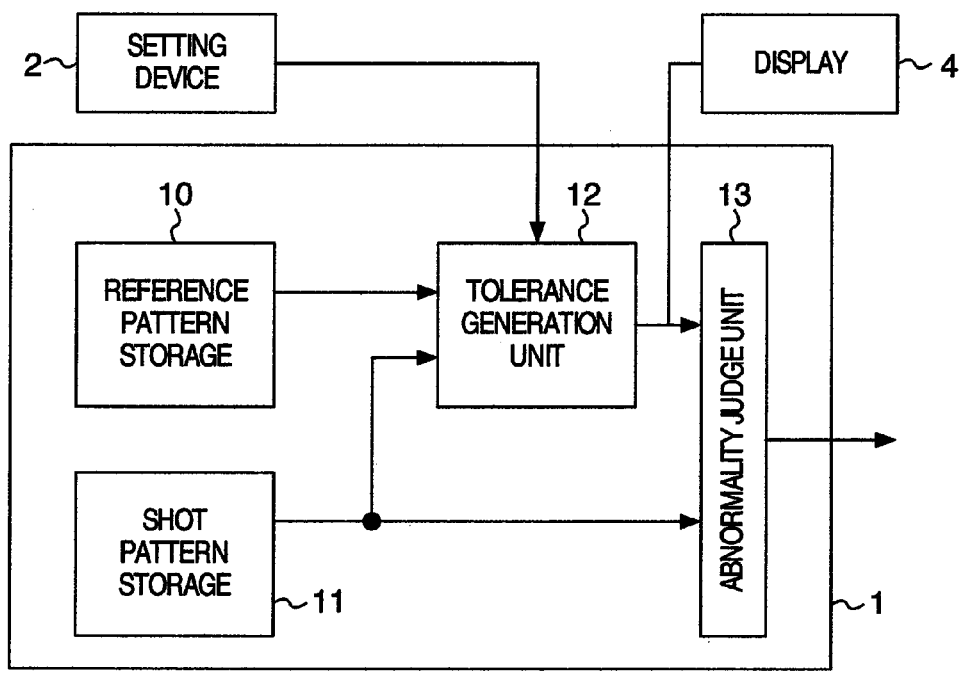
FIG. 18 is a block diagram showing a configuration of an apparatus of the present invention.

Additionally, by disposing an abnormality notification device 3, if no contour is detected before the search end position LS and an abnormality is determined, it is possible to output the condition. In this situation, it is considerable that information items including in which one of the expanding and shrinking directions the abnormality is determined are also outputted as abnormality information. Moreover, it is considerable that the abnormality in this situation is outputted as information of an abnormality other than a disconnection and a contact of the pattern. In addition, by disposing a display 4 as shown in FIG. 18, it is considerable to display the abnormality information described above.

Incidentally, the correspondence between the pattern to be picked up and the design data is highly precisely established at present by a positional correction through matching between the stage movement value and the image pickup image. Although the matching is conducted for the overall image in this situation, it is considerable that the matching is effectively applicable also to the detection of the position of a part. The template matching is a known technique, and hence, description of details thereof will be avoided. Description will now be given only of the concept of the matching employed in the part detection.

Figure 7:
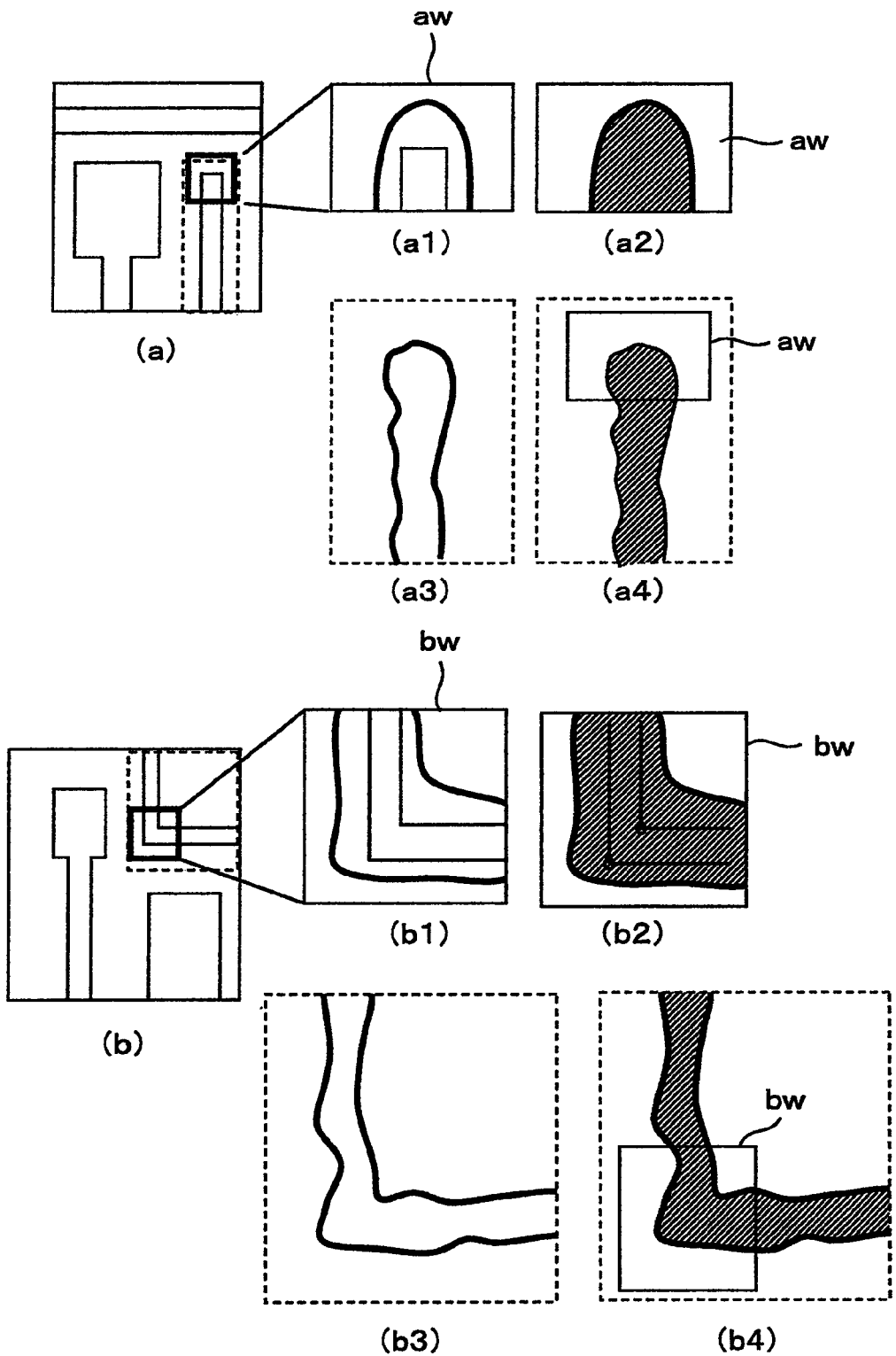
FIG. 7 is a diagram showing a concept of a part detection method based on matching.

FIG. 7 shows the concept of a method of detecting a part based on the matching. It can be considered as indicated by (a1) that an image (wide line) beforehand produced through simulation by adding distortion due to a proximity effect or the like during the creation of a pattern based on design data (narrow line) of a line end is prepared as a template aW in advance to conduct the matching. In this situation, it is considerable that the matching is conducted to improve precision, that is, for an image of closed figure type, a solid image painted over as indicated by (a2) is used as a template aW in place of a contour image; also, for an image pickup pattern contour image (a3), a solid image produced, based on information of the design data, by painting out like a closed figure type as indicated by (a4) is used as a template.

Thereafter, the matching is conducted between the template image position employed as a template and the image position in the image pickup image to obtain the difference as the amount of deformation. Further, also for the corner section, a template is similarly produced such that the difference resultant from the matching conducted between the template image position and the image position in the image pickup image can be obtained as the deformation amount. Also, for a straight line section and other parts, it is possible to obtain the amount of deformation of a part by partially producing a template to conduct the matching in a similar way. In this situation, it is also considerable to dispose a threshold value for a range of the search for the matching like in the detection of a line end described in conjunction with FIG. 6. It can be similarly considered that if the matching position is not determined within the threshold value, an abnormality is determined to similarly notify abnormality information to the user.

In addition, by obtaining partial deformation amounts, deformation of the entire image can be obtained by comprehensively using the partial deformation amounts.

For example, by obtaining inclinations of straight line sections, an inclination of the entire image can be obtained. If the reference pattern image is the design data, an ideal straight line mainly appears and the inclination is easily obtained. For an image pickup pattern image, the inclination thereof obtained by use of a partial straight line is not correct due to distortion caused by the charging and the proximity effect. However, a correct inclination can be obtained by using information pieces of straight lines in a wide range. The inclination can be calculated by establishing an equation for straight lines by using the method of least squares. In a situation in which a part of the reference pattern image, positional information of the part, and a reference pattern image thereof are obtained from the part detection section 121, if the part is a straight line section, an inclination of a straight line section in the reference pattern image is first obtained to be stored in the deformation amount storage 1254. Thereafter, a straight line section is detected in the image pickup pattern image to obtain an inclination thereof to obtain difference between the inclinations of the associated straight line sections (inclination of the straight line in the reference pattern image—inclination of the straight line in the image pickup pattern image). If a plurality of straight line sections exist, there are obtained a plurality of inclination differences. The obtained inclination differences are stored in the deformation amount storage 1254. Since the method of least squares is known, description thereof will be avoided.

Figure 8:
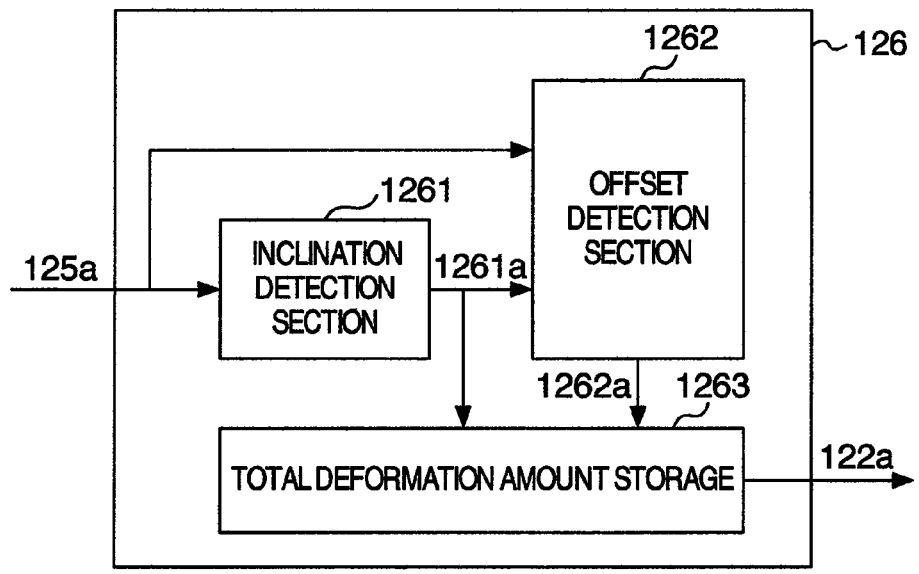
FIG. 8 is a diagram showing a block configuration example of a total deformation amount calculation section of the present invention.

FIG. 8 shows a block configuration example of the total deformation amount calculation section. In an inclination detection section 1261, an inclination of the entire image is obtained based on straight-line inclination information stored in the deformation amount storage 1254. Information of the obtained inclination of the entire image is stored as total inclination information in a total deformation amount storage 1263. Additionally, a total offset value is obtained based on the obtained inclination information, the obtained amount of deformation of each part, and the positional information of the part of the reference pattern image. The obtained total offset value is also stored in the total deformation amount storage 1263.

For the total inclination information (overall inclination) obtained in the inclination detection section 1261, it is considerable that a mean value is calculated for the inclination differences associated with all straight line sections stored in the deformation amount storage 1254, and the mean value is then set as the total inclination information.

Figure 9:
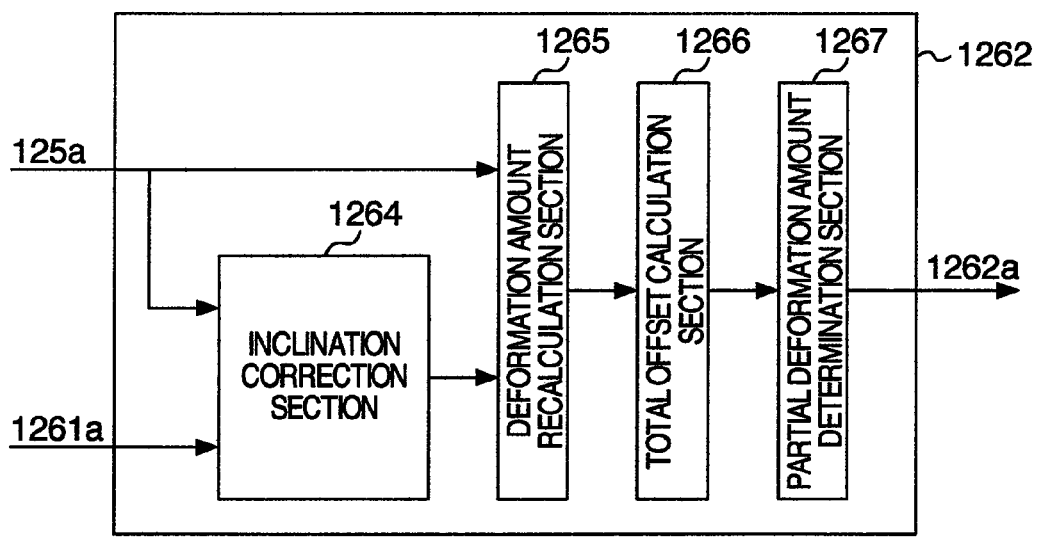
FIG. 9 is a diagram showing a block configuration example of an offset detection section of the present invention.

FIG. 9 shows a block configuration example of the offset detection section of the present invention.

In the offset detection section 1262, an inclination correction section 1264 provides, by using the inclination obtained by the inclination detection section 1261, an inclination to the positional coordinates of the pattern section of the reference pattern image stored in the deformation amount storage 1254. The method to provide an inclination to (to rotate) the position indicated by coordinates may be implemented only by a conversion of coordinates and is known; and hence, description thereof will be avoided.

A deformation amount recalculation section 1265 calculates difference in x and y coordinates (a change in the coordinates due to the inclination) using the positional coordinates of the part of the reference pattern image and the positional coordinates obtained through the inclination and adds the difference to the deformation amount of each part stored in the deformation amount storage 1254. That is, though this operation, there is obtained an amount of deformation of each part not including the total inclination difference.

Figure 10:
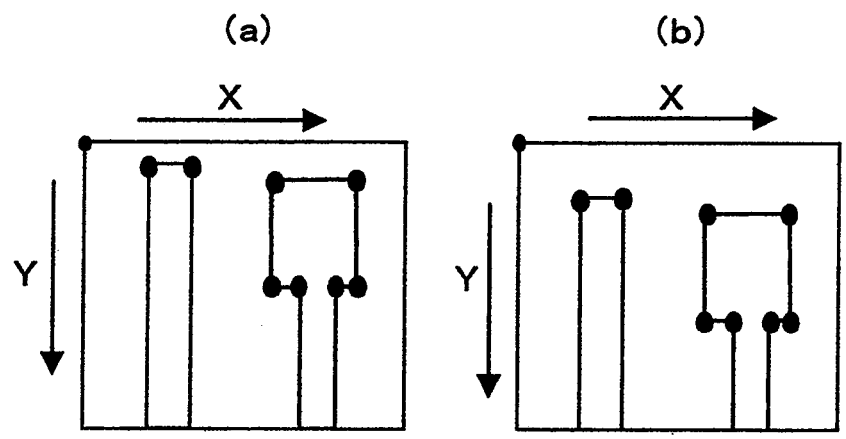
FIG. 10 is a diagram showing a comparison example of an image part including a total offset value.

A total offset calculation section 1266 calculates a total offset value of the image based on the obtained deformation amount of each part and the positional information of the part of the reference pattern image. For example, the calculation section 1266 conducts comparison, as shown in FIG. 10, between an image (a) generated based on the positional information of the part of the reference pattern image in which the inclination has been corrected and an image pickup pattern image (b). In this situation, the longitudinal direction (X direction)→ is assumed as a positive (plus) direction and the vertical direction (Y direction)→ is assumed as a negative (plus) direction. Assuming that the total offset is in the positive (plus) direction in terms of the vertical direction (Y direction)→, there exists no change in the X direction, but the entire image shifts in the positive direction in the Y direction. In this situation, the positive-directional shift takes place in the parts of all line ends, all corner sections, and all straight line sections of the longitudinal lines. Hence, in terms of the x or y coordinate, if the difference is positive (plus) at all positions of each part, it is assumed that the offset is possibly a positive offset, and the minimum value of absolute values of the differences at all positions of each part is stored to be set as a total offset in the x or y coordinate. It is considerable in this situation that for the straight line section of each part, only the straight line in the vertical line is referred to (the straight line in the longitudinal line is not checked) to obtain an offset in the x coordinate, and only the straight line in the longitudinal line is referred to to obtain an offset in the y coordinate. Ordinarily, there exist various situations such as a situation in which the width between patterns of an image of the image pickup pattern is wider or narrower than the width between patterns of an image of the reference pattern. However, an event in which the deformation takes place in all parts other than the straight line sections parallel to the detecting direction in the positive or negative direction in conformity with the x or Y coordinate cannot be easily considered if the total offset does not exist. Incidentally, even when no offset actually exists, if each of the parts is shifted in one direction, it is considerable that no problem takes place even if the correction is made to the minimum extent. Also in a situation in which the difference is minus (negative) at all positions of each part, the offset is similarly obtained. The obtained offset value is set as the total offset value.

Also, in a partial deformation amount determination section 1267, the total offset value obtained by the total offset calculation section 1266 is added to the deformation amount of each part for which the total inclination difference from the deformation amount recalculation section 1265 has been corrected. That is, there is obtained the deformation amount of each part in a state not including the offset.

In the total deformation amount storage 1263, there are stored the total inclination information, the X and Y total offset values, a part of the reference pattern image and its positional information, and the deformation amount of each part in a state not including any inclination and any offset in the image pickup pattern image corresponding to the part. Assume now that the total inclination information and the total offset value are represented as a total deformation amount and the deformation amount of each part after the correction of the total deformation is represented as a partial deformation amount. An output 1221 from the deformation amount detection section 122 includes the total deformation amount, the part of the reference pattern image and its positional information, and the partial deformation amount associated therewith.

Incidentally, in a situation of the configuration shown in FIG. 17, it is considerable that if there exists a total inclination and there exists a shift in the position of the total offset, the condition is notified to the user. It is also considerable that, by disposing a threshold value, if there exists a shift equal to or more than the threshold value, an abnormality is determined. It can also be considered that the user sets the threshold value.

Figure 11:
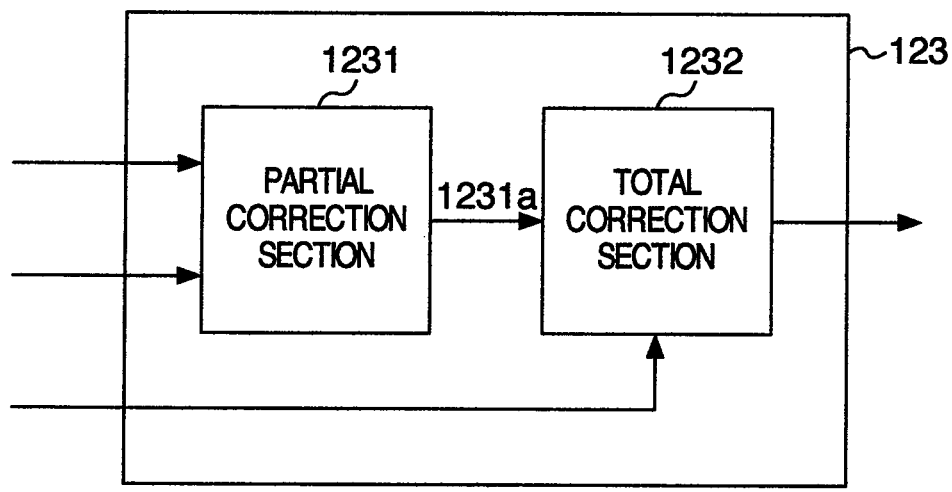
FIG. 11 is a diagram showing a block configuration example of a reference pattern correction unit of the present invention.

FIG. 11 shows a block configuration example of the reference pattern correction unit of the present invention.

A partial correction section 1231 partially corrects a reference pattern image 10a in the reference pattern storage based on the output 122a from the deformation amount detection section 122, the output including the information of a part of the reference pattern image, its positional information, and the deformation amount of each part. Thereafter, based on the information of total inclination of the output 122a from the deformation amount detection section 122 and the total offset values of X and Y coordinates, a total correction section 1232 corrects a reference pattern image 1231*a* which has been partially corrected.

Figure 12:
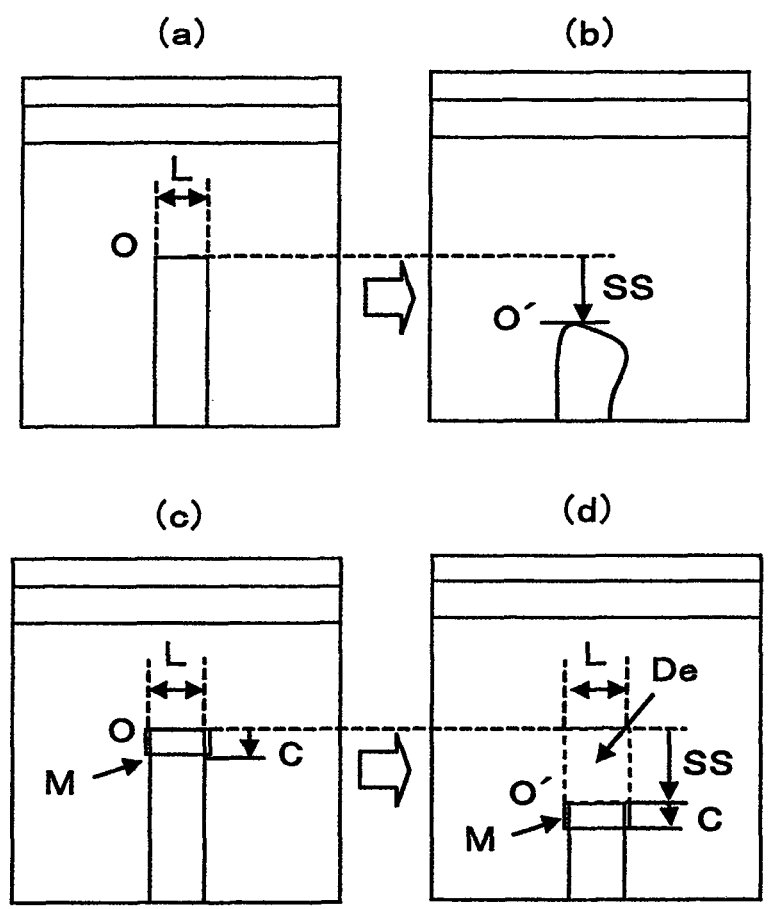
FIG. 12 is a diagram of a processing concept to partially correct a line end at shrinkage.

FIG. 12 shows an outline of processing to shrink a line end of a reference pattern image in the partial correction section.

First, a region M having width M and length C relative to an upper edge of a line end of a reference pattern image (c) is stored in advance. Thereafter, the system deletes pixels of a contour of a shrinking direction region De which has a length represented by the deformation amount (difference value) S in the shrinking direction obtained by the deformation amount detection section based on design data (a) and image pickup pattern image (b) and which has width L, beginning at an upper edge of a line end shown in (d). For example, when the contour pixel is "0" and non-contour pixel is "255", a region with width L and length S is set to "255" beginning at the upper edge of the line end. By overwriting thereafter the beforehand stored contour image of region M in a region beginning at a position lower by S relative to the upper edge.

Figure 13:
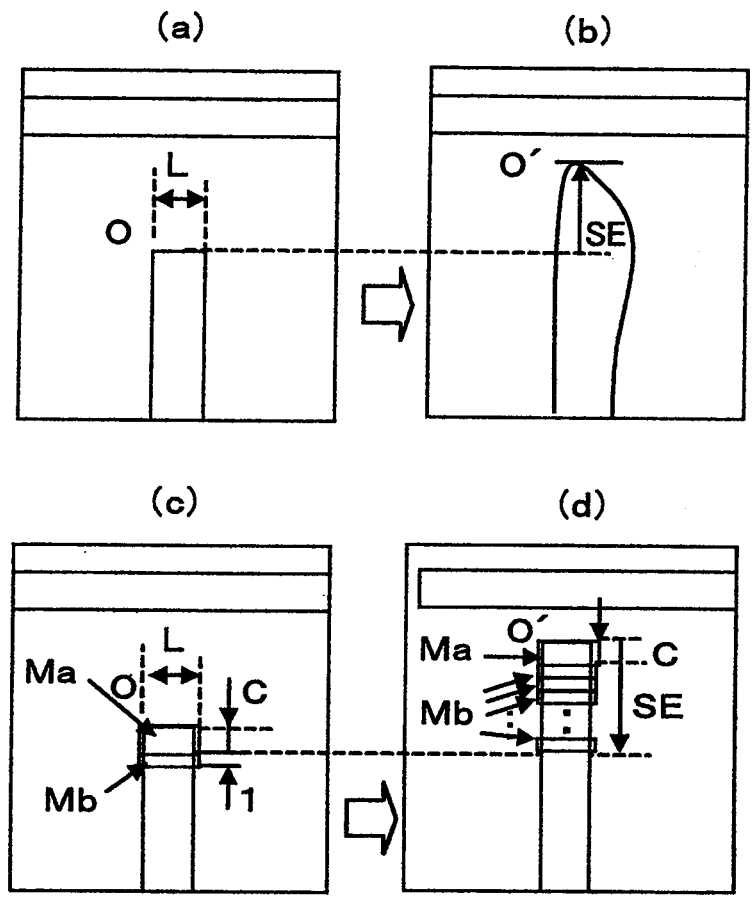
FIG. 13 is a diagram of a processing concept to partially correct a line end at expansion.

In addition, FIG. 13 shows an outline of processing to expand a line end of a reference pattern image in the partial correction section. First, the system beforehand stores a region Ms having width L and length C relative to an upper edge of an line end of a reference pattern image (c) and a region Mb having width L and length l at a position apart by C from the upper edge of the line end of a reference pattern image (c). Thereafter, the beforehand stored region Ma is overwritten in a region for the deformation amount (difference value) E in the shrinking direction obtained by the deformation amount detection section based on design data (a) and image pickup pattern image (b), beginning at position O' determined by expanding the upper edge of the line end shown in (d) in the expanding direction. After this point, the system overwrites Ma in the beforehand stored region Mb for the length obtained by subtracting length C from the length E, by changing the position in a one-unit-by-one-unit fashion, to thereby implement the processing.

Figure 14:
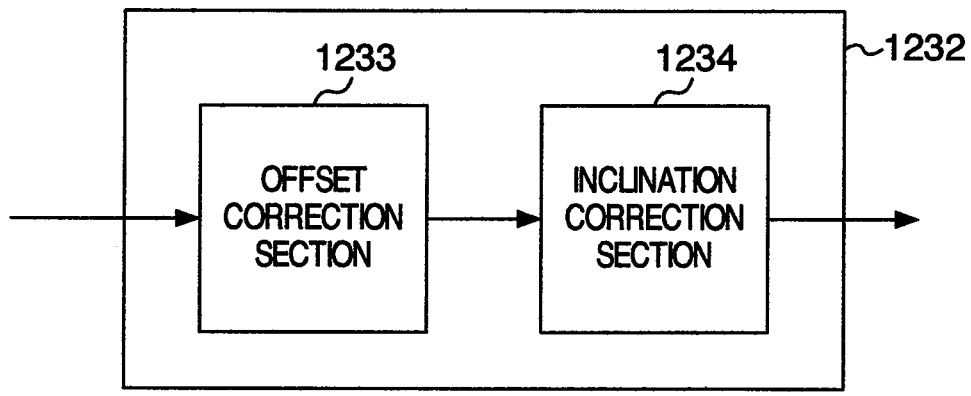
FIG. 14 is a diagram showing a block configuration example of a total correction section according to the present invention.

FIG. 14 shows a block configuration example of the total correction section of the present invention. The total correction section 1232 corrects the total offset of the reference pattern image 1231*a* which has been partially corrected by the offset correction section 1233, based on the total offset value of the output from the deformation amount detection section 122.

The correction can be simply conducted by replacing the x and y positional coordinates of each pixel of the image by the coordinates obtained by subtracting the x and y offset values from the x and y positional coordinates. Although a region without data appears in an edge of the image after the correction, it is considerable that such region is a region not to be used after this point as a region beyond the abnormality judgment range. After the total offset is corrected, an inclination correction section 1234 corrects the inclination based on the total inclination information of the output from the deformation amount detection section 122. For example, it is considerable that the inclination correction is generated through a four-neighborhood-pixel bi-linear interpolation for pixels corresponding to pixel positions after the correction.

Figure 15:
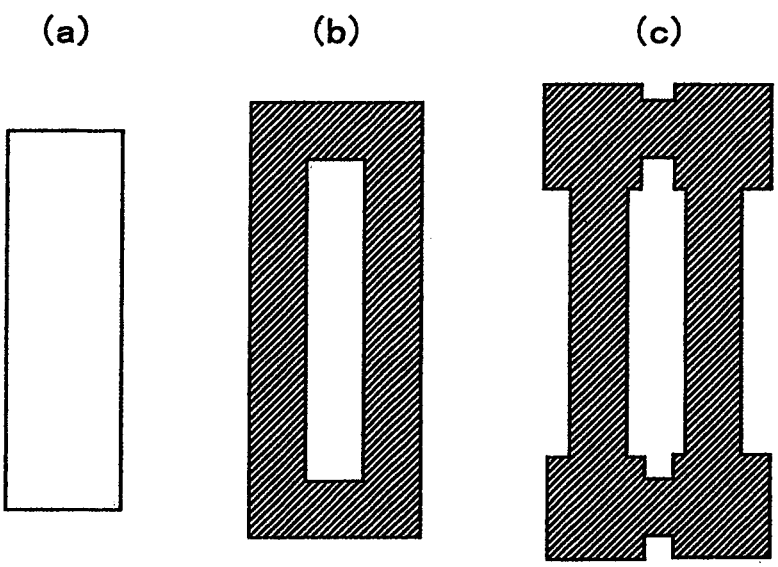
FIG. 15 is a diagram showing a concept of creation of a tolerance.

The tolerance generation unit 12 generates the tolerance based on the corrected reference pattern image. In the tolerance generation, it is considerable to generate the tolerance by expanding an edge of the reference pattern image. For example, for a rectangular reference pattern image as shown in (a) of FIG. 15, it is possible that the edge of the reference pattern image is expanded to use the width of the edge as the tolerance. Also, since the coordinates of parts are known, by beforehand setting tolerance to each part, the tolerance can be determined based on the coordinates of a part detected in the operation. For example, it is also considerable to set mutually different allowable widths respectively to the corner section and the straight line section as shown in (c), and in this situation, the allowable width is wider in the corner section than in the straight line section. It is also possible that the pattern is beforehand displayed such that the user specifies a part on a screen to designate the tolerance. Or, it is further possible, by beforehand determining the tolerance for each part, to automatically detect a part to automatically generate the tolerance for the part thus detected.

Figure 16:
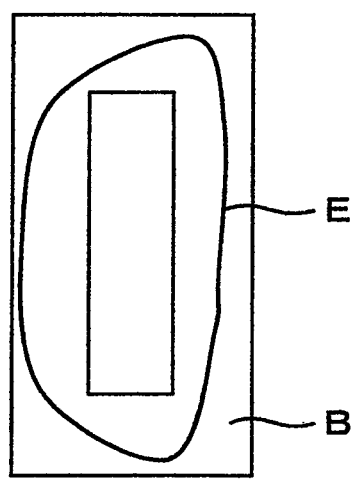
FIG. 16 is a diagram showing a concept of abnormality judgment using a tolerance.

Moreover, in the abnormality judge unit, if a contour E of the image pickup pattern image is beyond tolerance B generated by the tolerance generation unit as shown in FIG. 16, an abnormality is determined; and if the contour E is within the tolerance B, it is determined that no abnormality is present, and a judge result is outputted. The judge result may be displayed on the display 4 or may be stored in a memory. The judge result may also be outputted to a printer. Although the tolerance is disposed in an image area in this situation, it is also possible that data is converted, for example, into the system of polar coordinates based on an image to set the tolerance in the polar coordinate system to thereby judge an abnormality.

Figure 19:
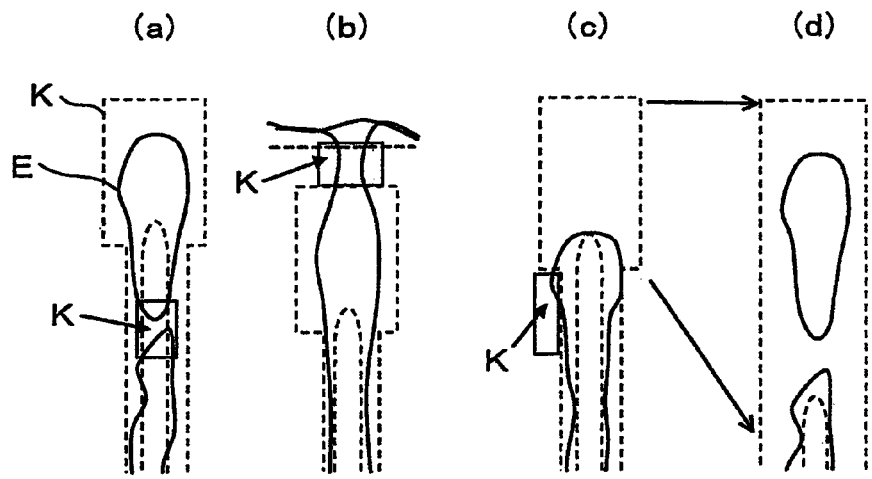
FIG. 19 is a diagram showing thinning and fattening of a pattern.

Additionally, it is considerable that, by disposing a display 4 as shown in FIG. 18, the tolerance before correction and the tolerance after correction are displayed at the same time. Also, the positions of an abnormality before and after the tolerance correction may be displayed at the same time. It is also considerable to dispose a mode change section as shown in FIG. 19 such that a mode to use both of the partial and total correction sections or a mode to use either one thereof is selected for operation. In this situation, before and after the tolerance correction, the positions of the abnormality may also be displayed on the display 4 at the same time. In the description, "before correction" may be a state in which the reference pattern image is employed or a state just before a change of a parameter.

Figure 20:
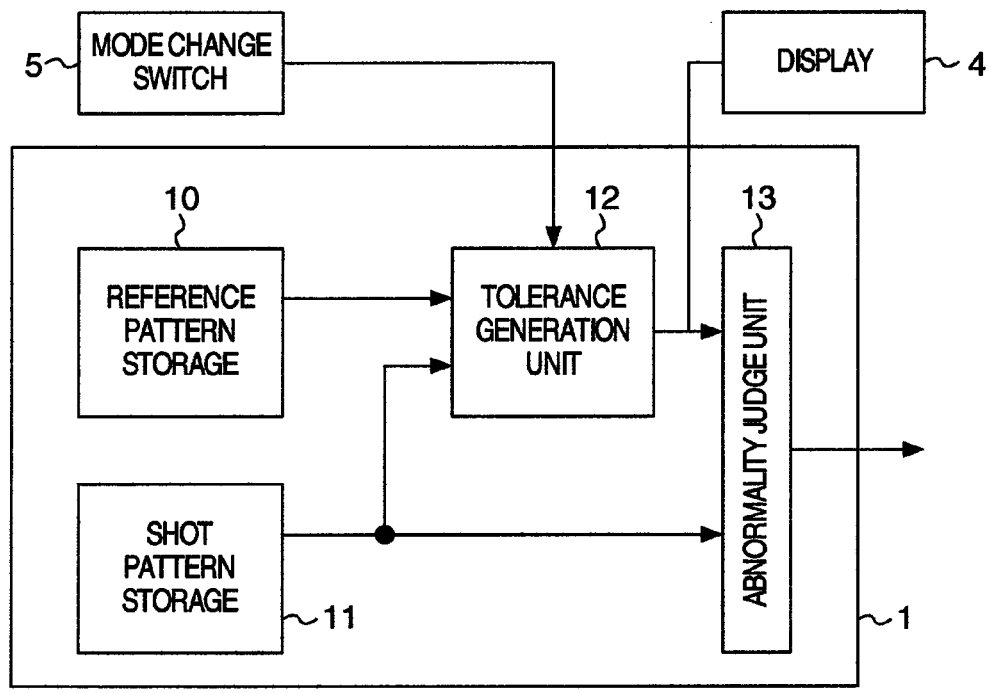
FIG. 20 is a block diagram showing a configuration of an apparatus of the present invention.
Figure 21:
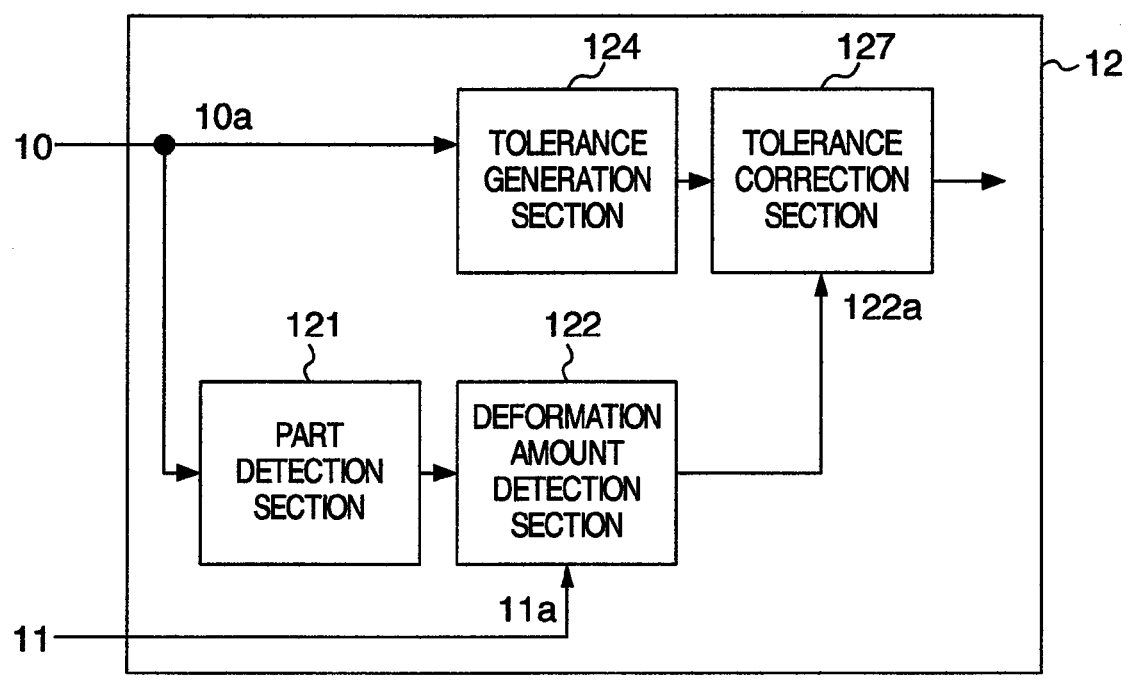
FIG. 21 is a diagram showing a configuration example of a tolerance generation unit of the present invention.

Further, the tolerance is obtained after the reference pattern image is corrected in this situation. However, it is also possible, as shown in FIG. 20, that after the tolerance generation section 124 creates the tolerance based on the reference pattern image, a tolerance correction section 127 corrects the generated tolerance based on the deformation amount obtained by the deformation amount detection section 122. The tolerance correction section 127 in this situation can be implemented in a configuration similar to that of the reference pattern correction section 123. However, although the correction range is the line width L of the pattern in the reference pattern correction section 123, since the tolerance is generated by expanding the reference pattern by a particular value, the tolerance is corrected for the width or length associated with the expansion. Also in this situation, it is possible that by disposing a change section to conduct both or either one of the partial correction and the total correction, the user changes the operation for correction.

Additionally, it can also be considered that when the reference pattern image as a basis of the tolerance is corrected or the tolerance is corrected, the event of correction is notified to the user. Also, it is considerable to output or to notify, to the user, the contents of corrected items, e.g., information of total correction items, a total inclination, and an offset as well as the partial contents including information such as positional shifts, expansion, and shrinkage of a line end, a straight line, and a corner section. Further, a pattern inspection unit 1 of the present invention may be implemented by software processing. In such situation, the software processing may be executed by a personal computer or may be incorporated in a Large Scale Integration (LSI) device to implement the pattern inspection unit 1 by hardware processing.

As clarified in the description above, a reference pattern image as a reference of an image pickup pattern image as a judge object is stored in the reference pattern storage and an image pickup pattern image produced by shooting a pattern is stored in the image pickup pattern storage. To beforehand obtain the tolerance of the image pickup pattern, the tolerance generation unit generates the tolerance associated with an image of the pattern thus shot by referring to the image pickup pattern image based on the reference pattern. Only a disconnection or a contact of the image pickup pattern is assumed as an abnormality and a pattern including deformation is judged to be a normal pattern. Hence, by obtaining an amount of deformation from the image pickup pattern image and by deforming the reference pattern image as a basis of the tolerance according to the deformation, there can be generated tolerance including the deformation. Hence, it is possible in the processing to determine only a disconnection or a contact of the image pickup pattern as a pattern abnormality.

Furthermore, as for the deformation, there exists a situation in which the image pickup pattern is partially deformed due to the excessive or insufficient shrinkage or proximity effect or a situation in which the image pickup pattern is totally deformed due to distortion such as the shift in the image pickup position (rotation, offset shift) caused by a positional correction error due to distortion by the charging, the stage movement, the image matching, and the like. Hence, a pattern is subdivided into parts to detect a deformation amount of each part, and the total deformation amount is obtained using deformation amounts of a plurality of parts. The partial deformation is again corrected in consideration of the total deformation amount; and based on the partial deformation amount, a basic pattern image is first partially corrected and then is totally corrected based on the total deformation amount. Based on the corrected basic pattern, the tolerance generation unit generates tolerance, which makes it possible to generate the tolerance associated with deformation including the total deformation of the pattern and the partial deformation thereof. Then, by conducting the abnormality judgment in the tolerance associated with the deformation, it is possible to determine only a disconnection or a contact of the image pickup pattern as an abnormality with high precision.

Moreover, in the deformation amount detection section to obtain an amount of deformation, it is prevented by disposing the tolerance that an image pickup pattern image which has a great amount of deformation or which has no edge is judged as a normal pattern. Hence, if no contour of the image pickup pattern image is detected within the tolerance, an abnormality is assumed at this point to notify the abnormality to the user. Also, the user may set the tolerance for the deformation.

Incidentally, in conjunction with the embodiments above, description has been given of a pattern inspection apparatus and a method thereof to inspect primarily an electronic device pattern. However, the present invention is similarly applicable also to a pattern processing apparatus to obtain data of a reference pattern for pattern inspection to be used in the a pattern inspection apparatus and a method thereof, the pattern processing apparatus not determining acceptability of an electronic device pattern as a final measurement object.

INDUSTRIAL APPLICABILITY

The present invention is similarly applicable to, in addition to a CD-SEM to inspect fine structure on a semiconductor wafer and the like, an imaging method and an imaging apparatus thereof to inspect a fine object by shooting the object.

REFERENCE SIGNS LIST

1 Pattern inspection unit
2 Setting device
3 Abnormality notification device
4 Display
5 Mode change switch (SW)
10 Reference pattern storage
11 Image pickup pattern storage
12 Tolerance generation unit
13 Abnormality judge unit
121 Part detection section
122 Deformation amount detection section
123 Reference pattern correction section
124 Tolerance generation section
125 Partial deformation amount calculation section
126 Total deformation amount calculation section
1231 Partial correction section
1232 Total correction section
1233 Offset correction section
1234 Inclination correction section
1251 Line end detection section
1252 Corner detection section
1253 Straight line detection section
1254 Deformation amount storage
1261 Inclination detection section
1262 Offset detection section
1263 Total deformation amount storage
1264 Inclination correction section
1265 Deformation amount recalculation section
1266 Total offset calculation section
1267 Partial deformation amount determination section

The invention claimed is:

1. A pattern inspection apparatus for detecting, based on image data of an object pattern obtained by picking up an image of an electronic device pattern, an abnormality including a defect by use of a tolerance for pattern deformation, the apparatus comprising:

a reference pattern storage for storing therein data based on a reference pattern associated with the object pattern as an object to detect an abnormality, the reference pattern including a first pattern edge portion and a second pattern edge portion;

an image data storage for storing therein data based on the image data of the object pattern;

a reference pattern compensator configured to partially compensate a location of the first pattern edge portion to be shrunk or expanded based on the reference pattern stored in the reference pattern storage such that the first pattern edge portion is to be placed at another location of another pattern edge portion while the second pattern edge portion maintains the same size, said another location of said another pattern edge portion being determined based on the image data stored in the image data storage; and an abnormality judger configured to set a tolerance based on the location compensated based on the reference pattern, and to judge the object pattern as abnormal when an outline of the object pattern is fallen outside of the tolerance.

2. The pattern inspection apparatus according to claim 1, further comprising:

a deformation amount detector configured to obtain deformation amount data by use of the data based on the reference pattern stored in the reference pattern storage and the data based on the image data of the object pattern stored in the image data storage, and a tolerance generator configured to generate data based on the tolerance of the object pattern by use of the data based on the reference pattern stored in the reference pattern storage and the deformation amount data obtained by the deformation amount detector.

3. The pattern inspection apparatus according to claim 2, further comprising:

a part detector configured to detect a part of a pattern by use of the data based on the reference pattern from the reference pattern storage, wherein the deformation amount detector obtains an amount of deformation by use of both image data obtained based on the image data stored in the image data storage, and data obtained based on the part of the pattern detected by the part detector.

4. The pattern inspection apparatus according to claim 3, wherein:

the reference pattern compensator is configured to compensate data, on the basis of the deformation amount data obtained by the deformation amount detector, and the data based on the reference pattern stored in the reference pattern storage, wherein the abnormality judger judges an abnormality of the object pattern by use of the data based on the tolerance generated by the tolerance generator and the data based on the image data in the image data storage.

5. The pattern inspection apparatus according to claim 4, wherein the deformation amount data includes data regarding an amount to be defined in accordance with information on both position and inclination of a pattern image.

6. The pattern inspection apparatus according to claim 4, wherein the reference pattern compensator comprises:

a whole compensating part configured to totally compensate data in accordance with the reference pattern; and a partial compensating part configured to partially compensate the data in accordance with the reference pattern.

7. The pattern inspection apparatus according to claim 1, wherein the reference pattern defines data including data in accordance with design data used for a semiconductor device corresponding to the object pattern.

8. The pattern inspection apparatus according to claim 1, wherein the data based on the reference pattern is data based on image data obtained through an imaging operation for a pattern.

9. A pattern inspection method of detecting, based on image data of an object pattern obtained by picking up an image of an electronic device pattern, an abnormality including a defect by use of a tolerance for pattern deformation, the method comprising steps of:

storing data based on a reference pattern associated with the object pattern as an object to detect an abnormality, the reference pattern including a first pattern edge portion and a second pattern edge portion;

storing image pickup data obtained by picking up an image of the object pattern;

partially compensating a location of the first pattern edge portion to be shrunk or expanded based on the reference pattern by placing the first pattern edge portion at another location of another pattern edge portion while the second pattern edge portion maintains the same size, said another location of said another pattern edge portion being determined based on the image pickup data; and setting a tolerance based on the location compensated based on the reference pattern, and judging the object pattern as abnormal when an outline of the object pattern is fallen outside of the tolerance.

10. The pattern inspection method according to claim 9, further comprising the steps of:

obtaining deformation amount data by use of the reference pattern data and the image pickup data; and generating data based on the tolerance of the object pattern by use of the reference pattern data and the deformation amount data.

11. The pattern inspection method according to claim 10, further comprising the steps of:

detecting a part of a pattern by use of the reference pattern data; and obtaining an amount of deformation by use of both data based on the part of the pattern and data based on the image pickup data.

12. The pattern inspection method according to claim 11, wherein:

data is compensated on the basis of the deformation amount data and the data based on the reference pattern, and an abnormality of the object pattern is judged by use of the data based on the tolerance and the image pickup data.

13. A pattern processing apparatus for obtaining, based on image data of an object pattern obtained by picking up an image of an electronic device pattern, a tolerance for pattern deformation, the apparatus comprising:

a reference pattern storage configured to store therein data based on a reference pattern associated with the object pattern as an object to detect an abnormality, the reference pattern including a first pattern edge portion and a second pattern edge portion;

an image data storage configured to store therein data based on the image data of the object pattern; and a reference pattern compensator configured to compensate a location of the first pattern edge portion to be shrunk or expanded based on the reference pattern stored in the reference pattern storage such that the first pattern edge portion is to be placed at another location of another pattern edge portion while the second pattern edge portion maintains the same size, said another location of said another pattern edge portion being determined based on the image data stored in the image data storage.

14. The pattern processing apparatus according to claim 13, further comprising:

a deformation amount detector configured to obtain deformation amount data by use of the data based on the reference pattern stored in the reference pattern storage and the data based on the image data of the object pattern stored in the image data storage, and a tolerance generator configured to generate data based on the tolerance of the object pattern by use of the data based on the reference pattern stored in the reference pattern storage and the deformation amount data obtained by the deformation amount detector.

15. The pattern processing apparatus according to claim 14, further comprising a part detector configured to detect a part of a pattern by use of the data based on the reference pattern from the reference pattern storage, wherein the deformation amount detector obtains an amount of deformation by use of both data obtained based on the part of the pattern detected by the part detector, and image data obtained based on the image data stored in the image data storage.

16. The pattern processing apparatus according to claim 15, wherein the reference pattern compensator is configured to compensate data on the basis of the deformation amount data obtained by the deformation amount detector, and the data based on the reference pattern stored in the reference pattern storage.

17. A pattern inspection apparatus for detecting, based on image data of an object pattern obtained by picking up an image of an electronic device pattern, an abnormality including a defect by use of a tolerance for pattern deformation, the apparatus comprising:
- a reference pattern storage configured for storing therein data based on a reference pattern associated with the object pattern as an object to detect an abnormality, the reference pattern including a first pattern edge portion and a second pattern edge portion;
- an image data storage configured for storing therein data based on the image data of the object pattern;
- a reference pattern compensator configured to partially compensate a location of the first pattern edge portion to be shrunk based on the reference pattern stored in the reference pattern storage such that the first pattern edge portion is to be placed at another location of another pattern edge portion while the second pattern edge portion maintains the same size, said another location of said another pattern edge portion being determined based on the image data stored in the image data storage; and
- an abnormality judger configured to set a tolerance based on the location compensated based on the reference pattern, and to judge the object pattern as abnormal when an outline of the object pattern is fallen outside of the tolerance.

18. A pattern inspection apparatus for detecting, based on image data of an object pattern obtained by picking up an image of an electronic device pattern, an abnormality including a defect by use of a tolerance for pattern deformation, the apparatus comprising:
- a reference pattern storage configured for storing therein data based on a reference pattern associated with the object pattern as an object to detect an abnormality, the reference pattern including a first pattern edge portion and a second pattern edge portion;
- an image data storage configured for storing therein data based on the image data of the object pattern;
- a reference pattern compensator configured to partially compensate a location of the first pattern edge portion to be expanded based on the reference pattern stored in the reference pattern storage such that the first pattern edge portion is to be placed at another location of another pattern edge portion while the second pattern edge portion maintains the same size, said another location of said another pattern edge portion being determined based on the image data stored in the image data storage; and
- an abnormality judger configured to set a tolerance based on the location compensated based on the reference pattern, and to judge the object pattern as abnormal when an outline of the object pattern is fallen outside of the tolerance.

\* \* \* \* \*